United States Patent
Sambongi

(10) Patent No.: US 7,960,676 B2
(45) Date of Patent: Jun. 14, 2011

(54) IMAGE CAPTURE DEVICE TO OBTAIN AN IMAGE WITH A BRIGHT SUBJECT, EVEN WHEN THE BACKGROUND IS DARK, AND RECORDING MEDIUM

(75) Inventor: Masao Sambongi, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 251 days.

(21) Appl. No.: 12/239,083

(22) Filed: Sep. 26, 2008

(65) Prior Publication Data

US 2009/0084939 A1 Apr. 2, 2009

(30) Foreign Application Priority Data

Sep. 28, 2007 (JP) .................................. 2007-256213
Aug. 6, 2008 (JP) .................................. 2008-203649

(51) Int. Cl.
*H01L 27/00* (2006.01)
*G02B 7/04* (2006.01)
(52) U.S. Cl. .................... 250/208.1; 250/201.2
(58) Field of Classification Search ............... 250/208.1, 250/201.2, 201.4, 201.5; 348/159, 143, 148, 348/149, 135–142, 345–357; 396/77–82
See application file for complete search history.

(56) References Cited

U.S. PATENT DOCUMENTS

2005/0219642 A1* 10/2005 Yachida et al. ............... 358/448
2009/0322891 A1* 12/2009 Kondo et al. ............... 348/218.1

FOREIGN PATENT DOCUMENTS

EP 1 061 487 * 12/2000
JP 2007-049374 A 2/2007

* cited by examiner

*Primary Examiner* — Que T Le
*Assistant Examiner* — Pascal M Bui-Pho
(74) *Attorney, Agent, or Firm* — Holtz, Holtz, Goodman & Chick, PC

(57) ABSTRACT

A digital camera includes: an image capture data creation unit; a CPU for directing the image capture data creation unit to perform image captures several times and acquire a plurality of image capture data; and an image processing device that determines whether or not a common specific image region exists in a plurality of image capture data acquired by the CPU and, in the case where it is determined that a specific image region exists, performs a pixel additive synthesis for image data of the specific image region and creates image data.

6 Claims, 15 Drawing Sheets

_US 7,960,676 B2_

IMAGE CAPTURE DEVICE TO OBTAIN AN IMAGE WITH A BRIGHT SUBJECT, EVEN WHEN THE BACKGROUND IS DARK, AND RECORDING MEDIUM

BACKGROUND OF THE INVENTION

1. Field of the Invention

The present invention relates to an image capture device and a recording medium.

2. Description of the Related Art

Conventional image processing technology exists for digital cameras to brighten images of human faces, etc. even in the case where a background is dark during an image capture.

In particular, the digital camera recited above consecutively performs a normal image capture and an image capture using light emitted by a light emitting device such as a strobe. The digital camera also performs a pixel addition for the entire images obtained by these image captures. Thus, the digital camera records a bright image for the main subject, for example, even in the case where a dark background results in a dark entire image.

SUMMARY OF THE INVENTION

The present invention is directed to obtain an image in which a main subject is brightened even in the case where the entirety is dark.

To achieve the object recited above, an image capture device of the present invention includes: an image capture unit that performs an image capture and acquiring image capture data; an image capture control unit that directs the image capture unit to perform image captures several times and acquire a plurality of image capture data; a determination unit that determines whether or not a common specific image region exists in a plurality of image capture data acquired by a direction of the image capture control unit; and an image data creation unit that performs a pixel additive synthesis for image data of a specific image region in the case where the determination unit determines that the specific image region exists and creates image data.

Furthermore, in order to achieve the object recited above, a recording medium of the present invention stores a program that causes a computer to function as a determination unit that determines whether or not a common specific image region exists in a plurality of image capture data acquired by several times image captures; and an image data creation unit that performs a pixel additive synthesis for image data of a specific image region in the case where the determination unit determines that the specific image region exists and creates image data.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Hereinafter, an image capture device according to a first embodiment of the present invention will be described with reference to the drawings.

Figure 1:
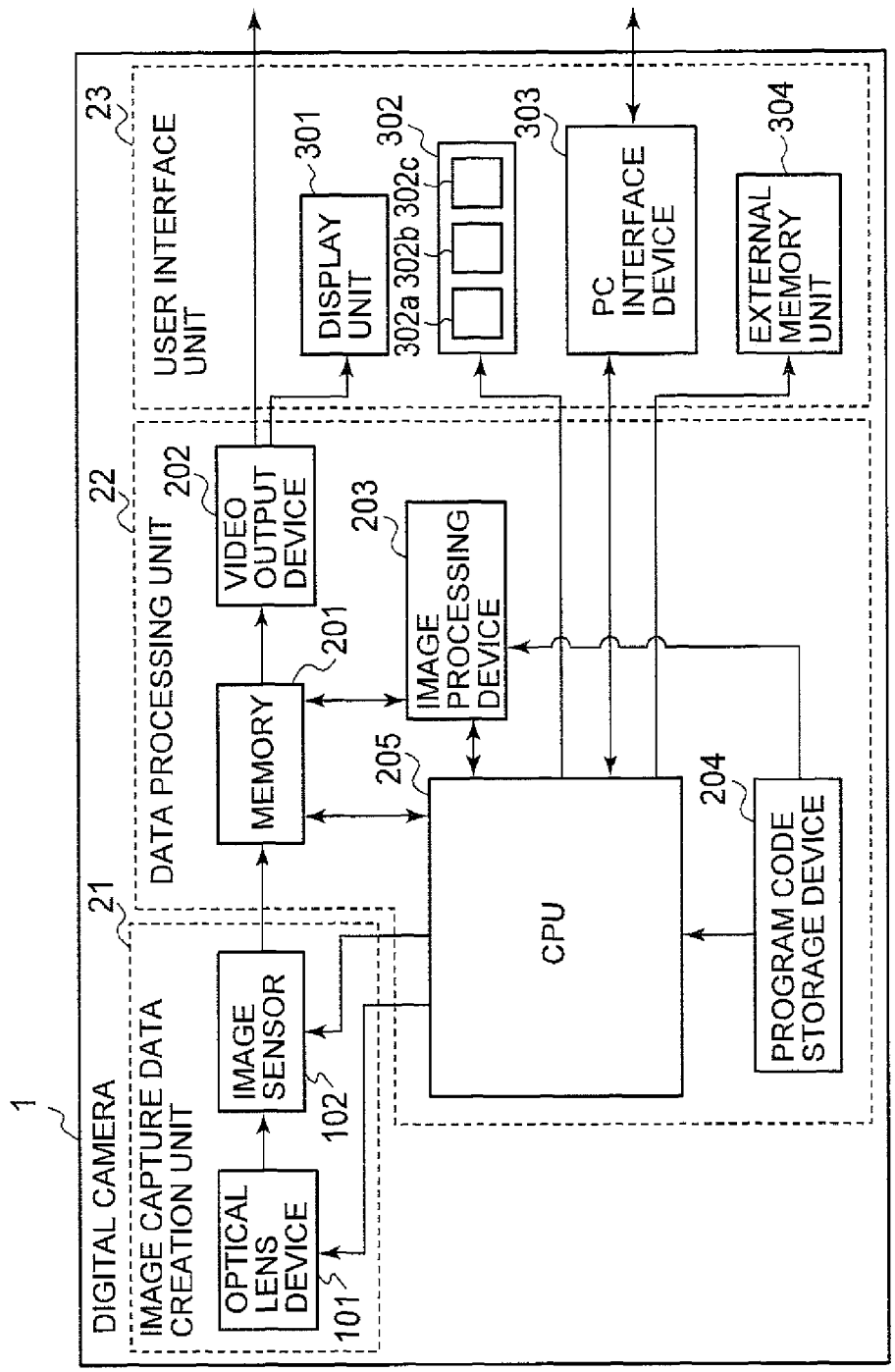
FIG. 1 is a block diagram illustrating an example of a configuration of a digital camera according to an embodiment of the present invention.

A digital camera 1 according to this embodiment includes an image capture data creation unit 21, a data processing unit 22, and a user interface unit 23, as illustrated in FIG. 1.

The digital camera 1 captures images several times in the case where an exposure value is equal to or less than a preset value. Then, the digital camera 1 determines, from the plurality of image capture data, a human facial image region as a specific image region (image region of the main subject) for which the specific image region is to be brightened. The digital camera 1 correspondingly adds pixels of the image capture data and the facial image data of the facial image region, and synthesizes the image capture data and the facial image data of the facial image region. Thus, the digital camera 1 increases the luminance of the facial image data even without illuminating the facial image region of the human by a strobe light.

A user interface unit 23 communicates various messages to a user and accepts user operations. The user interface unit 23 includes a display unit 301, an operation unit 302, a PC interface device 303, and an external memory unit 304.

The operation unit 302 accepts a user operation and acquires operation information indicating details of the operation. The operation unit 302 includes a power supply switch 302a, an image capture mode button 302b, and a shutter button 302c.

The power supply switch 302a turns the electric power supply of the digital camera 1 ON and OFF.

The image capture mode button 302b is pressed down when selecting a capture mode for image captures.

The shutter button 302c is the button pressed down when capturing images, operated by a two-stage stroke operation. A first stroke operation is generally referred to as "half press" or "half shutter". Upon performing the first stroke operation, the digital camera 1 executes an AF (Auto Focus) processing and an AE (Automatic Exposure) processing, and thereby fixes a focal state and an exposure state.

A second stroke operation is referred to as "pressed down fully." Upon performing the second stroke operation, the digital camera 1 captures an image at the focal state and the exposure state fixed by the first stroke.

The operation unit 302 detects operations by the user of these switches and buttons, and supplies operation information thereof to a CPU 205 of a data processing unit 22.

The display unit 301 displays an image. The display unit 301 includes, for example, a liquid crystal monitor. The display unit 301 displays a low resolution preview image and the like based on an RGB signal supplied by a video output device 202.

The PC interface device 303 converts image data, etc. into, for example, data according to the USB (Universal Serial Bus) standard, sends data to a computer (not illustrated) via a USB cable, and receives data from a computer.

The external memory unit 304 saves, for example, image data.

The image capture data creation unit 21 performs an image capture and acquires image capture data. The image capture data creation unit 21 includes an optical lens device 101 and an image sensor 102.

The optical lens device 101 includes, for capturing an image of a subject, a lens for concentrating light, as well as components such as a peripheral circuit for adjusting camera setting parameters such as focus, exposure, and white balance.

The image sensor 102 digitizes and collects the image formed by the light concentrated by the optical lens device 101. The image sensor 102 may include a CCD (Charge Coupled Device), an A/D (Analog to Digital) converter, etc.

The image capture data creation unit 21 can perform image captures at high resolution and image captures at low resolution (preview image capture). An image capture at low resolution uses an image resolution of about XGA (1024×768 dots), which is a low image resolution enabling the capture of video images and the reading of images at a rate of 30 fps (frames per second).

An image capture at high resolution provides an image resolution that is higher than that of an image capture at low resolution. An image capture at high resolution is possible, for example, at a resolution of four million pixels in the case where the digital camera 1 has a maximum of four million pixels usable for capturing images.

The data processing unit 22 acquires image capture data from the image capture data creation unit 21 and creates image data for outputting to the display unit 301, an external projector (not illustrated), etc. The data processing unit 22 includes a memory 201, the video output device 202, an image processing device 203, a program code storage device 204, and the CPU 205.

Figure 2:
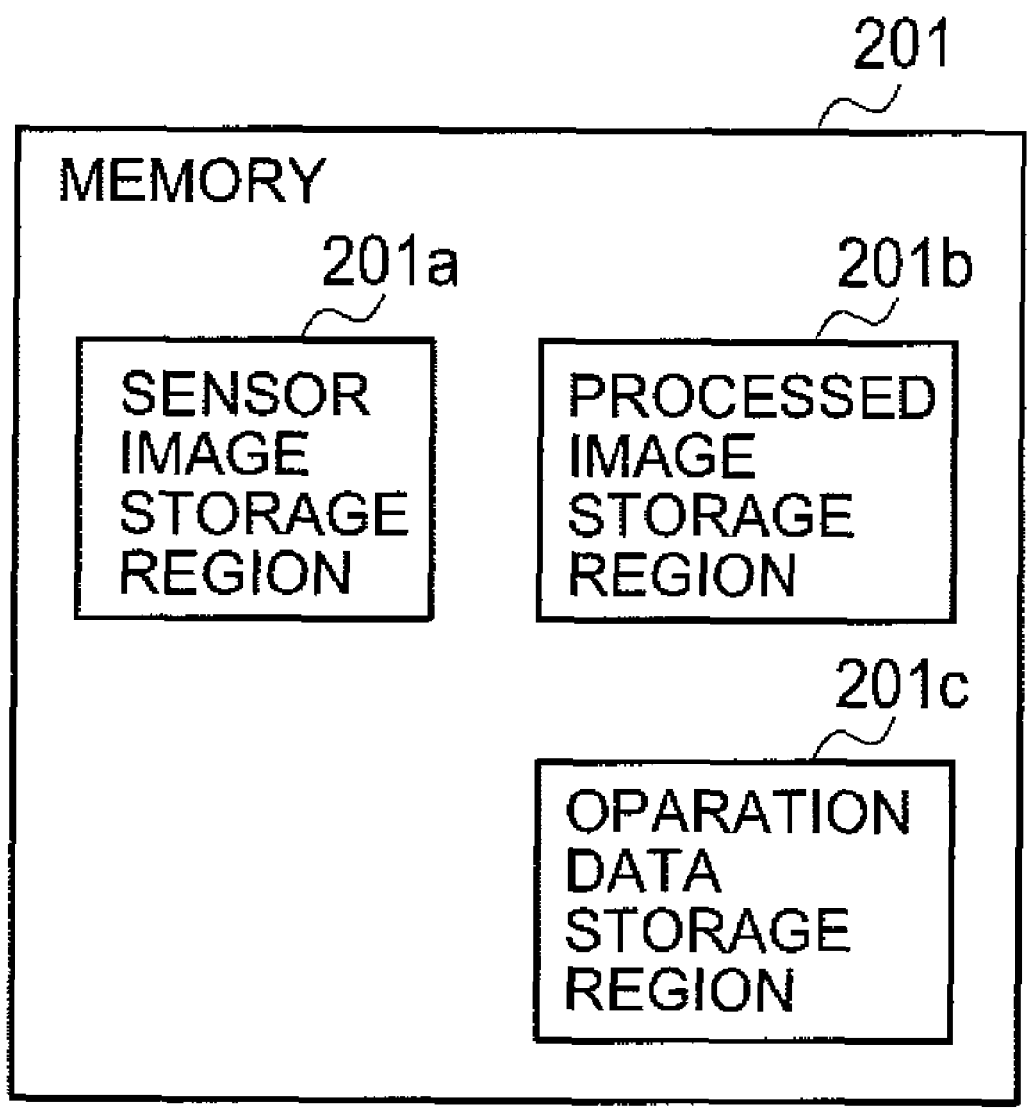
FIG. 2 illustrates an example of storage regions of a memory.

The memory 201 stores the image capture data that is entered and the image data that is created. The memory 201 has, as regions for storing the data, a sensor image storage region 201a, a processed image storage region 201b, and an operation data storage region 201c, as illustrated in FIG. 2.

The sensor image storage region 201a is a region for temporarily storing image capture data, collected by the image sensor 102, for each capture. The processed image storage region 201b is a region for temporarily storing the processed image capture data.

The operation data storage region 201c is a region for storing data necessary for an operation. The operation data storage region 201c stores, for example, characteristic data for determining a human face (facial characteristic data) as data necessary for an operation.

Returning to FIG. 1, the video output device 202 creates and outputs, for example, an RGB signal. The video output device 202 reads image data stored in the processed image storage region 201b of the memory 201, creates an RGB signal, and supplies the created RGB signal to the user interface unit 23.

Furthermore, the video output device 202 supplies the created RGB signal to a television, personal computer, projector, or other external device.

The image processing device 203 is controlled by the CPU 205 and performs image processing of the image capture data.

Upon instructions from the CPU 205 to execute image processing, the image processing device 203 acquires image capture data from the sensor image storage region 201a of the memory 201.

In the case where a plurality of frames, for example, two frames (an amount for two image frames) of image capture data is recorded in the sensor image storage region 201a of the memory 201, the image processing device 203 adds pixels of the image capture data of the two frames, synthesizes the image capture data, and increases the luminance of the facial image. For example, the image processing device 203 adds a luminance (gradation) G1 of each pixel of the facial image of the image capture data of the first frame to a luminance G2 of pixels corresponding to the facial image of the image capture data of the second frame; uses pixels having a gradation (G1+G2) as the pixels of a synthesized image; and thereby increases the luminance of the facial image.

In the case where the image processing device 203 adds pixels and synthesizes image capture data, a facial image region is first determined as a specific image region for increasing luminance.

The image processing device 203 determines whether or not a common facial image region exists in the image capture data of the two frames. Facial characteristic data is stored in advance in the operation data storage region 201c of the memory 201 for determining the existence or absence of the facial image region.

The image processing device 203 reads facial characteristic data from the operation data storage region 201c, compares the characteristic data and the image capture data, and determines the existence or absence of a facial image region.

In the case where it is determined that no facial image region exists in the image capture data of either of the two frames, the image processing device 203 performs a projective transformation and a position matching to provide a correspondence between the entire image capture data of the two frames, adds pixels of the image capture data of the two frames for each pixel, and thereby synthesizes the image capture data.

In the case where it is determined that a common facial image region exists in the image capture data of the two frames, the image processing device 203 designates the facial image region as a specific image region and acquires facial image data of the facial image region from the image capture data of the first frame (or the second frame).

Then, the image processing device 203, while performing the projective transformation and the position matching to provide a correspondence between the image data of the facial image region included in the image capture data and the acquired facial image data, adds pixels of the image capture data and the facial image data of the facial image region for each pixel, thereby obtaining one frame of synthesized image data. Thus, the image processing device 203 increases the luminance of the facial image data and compensates the exposure.

The image processing device 203 performs such an image processing, compresses the obtained image data, creates a file thereof, and records the image data file in the processed image storage region 201b of the memory 201.

Returning to FIG. 1, the program code storage device 204 stores programs executed by the CPU 205. The program code storage device 204 may include ROM (Read Only Memory), etc.

The CPU 205 controls each component according to programs stored in the program code storage device 204.

After a main electric power supply is turned ON, the CPU 205 turns the electric power supply of the digital camera 1 ON or OFF, for example, each time operation information indicating that a power button 302a is pressed down, is supplied by the operation unit 302 of the user interface unit 23.

In the case where the shutter button 302c is half pressed, the CPU 205 performs an image capture at low resolution and directs the image capture data creation unit 21 to acquire low resolution image capture data.

The CPU 205 determines an exposure value based on, for example, the acquired low resolution image capture data. The exposure value indicates an ability to transmit light, and is determined by a combination (product) of the degree of opening of an aperture and an exposure time.

Then, the CPU 205 compares the exposure value to a preset value. The preset value is a value for determining a degree of luminance of the image capture data and is stored in advance in the operation data storage region 201c of the memory 201.

In the case where the exposure value exceeds the preset value, the CPU 205 determines that the luminance of a subject (in other words, the gradation of the image data obtained from an image) is high. Then, the CPU 205 directs the image capture data creation unit 21 to acquire only one frame of the image capture data (an amount of one image frame) in the case where operation information, indicating that the shutter button 302c is pressed down fully, is supplied by the operation unit 302.

On the other hand, in the case where the exposure value is equal to or less than the preset value, the CPU 205 determines that the luminance of the subject is low. The CPU 205 performs an image capture at high resolution and directs the image capture data creation unit 21 to acquire two frames of high resolution image capture data in the case where operation information, indicating that the shutter button 302c is pressed down fully, is supplied by the operation unit 302. Then, the CPU 205 instructs the image processing device 203 to perform an image processing.

Now, an operation of the digital camera 1 according to this embodiment will be described.

Figure 3:
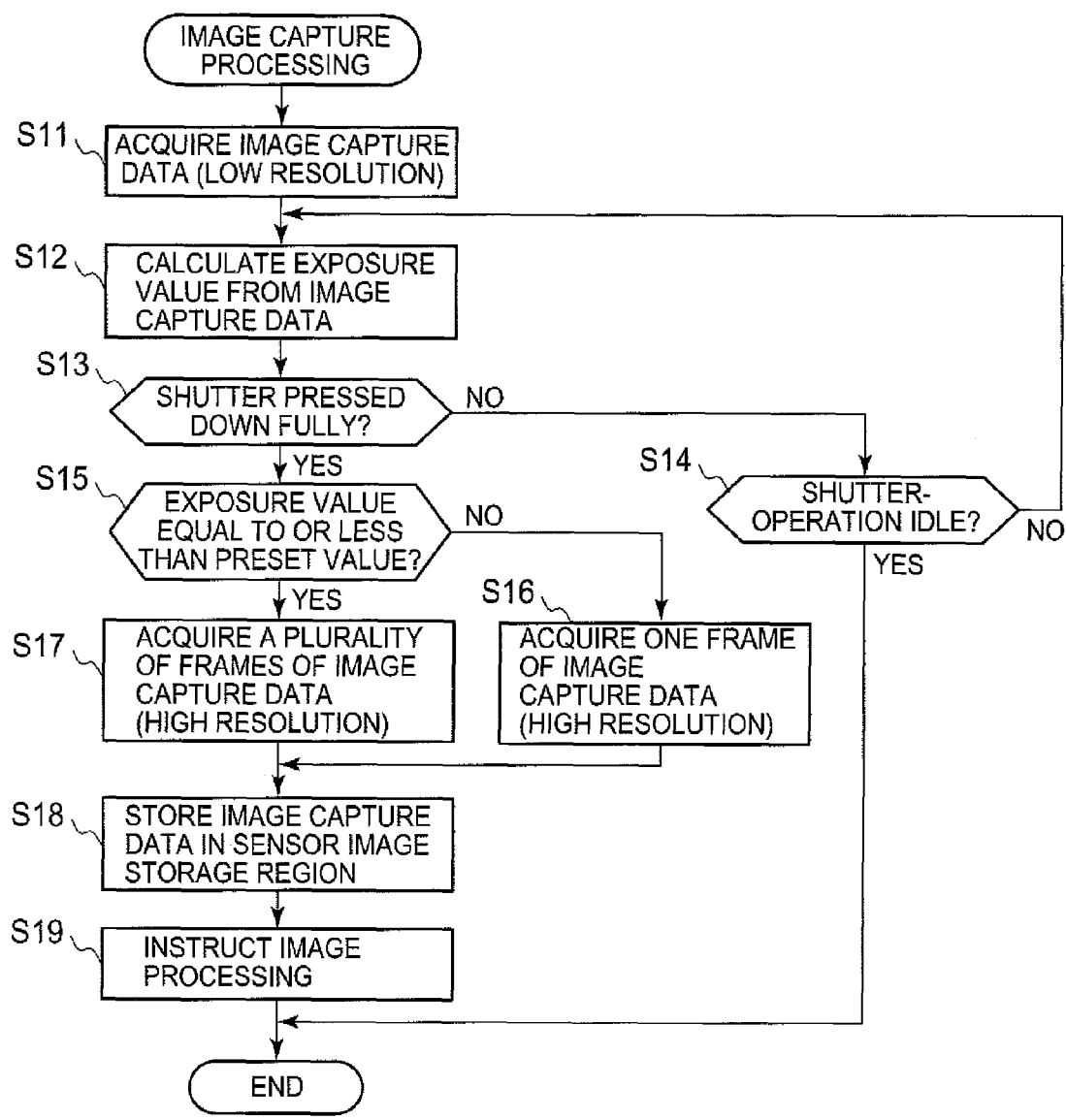
FIG. 3 illustrates a flowchart of an image capture processing executed by a CPU.

The CPU 205 reads program data for image capture processing from the program code storage device 204 and executes the image capture processing according to the flowchart illustrated in FIG. 3 in the case where operation information, indicating that the shutter button 302c is half pressed, is supplied by the operation unit 302.

The CPU 205 performs an image capture at low resolution and directs the image capture data creation unit 21 to acquire low resolution image capture data (step S11).

The CPU 205 calculates an exposure value from the acquired image capture data (step S12).

The CPU 205 determines whether or not the shutter button 302c is pressed down fully based on the operation information supplied by the operation unit 302 (step S13).

In the case where it is determined that the shutter button 302c is not pressed down fully (step S13: No), the CPU 205 determines whether or not the operation of the shutter button 302c is idle based on operation information supplied by the operation unit 302 (step S14).

In the case where it is determined that the operation is idle (step S14: Yes), the CPU 205 ends the image capture processing.

In the case where it is determined that the operation is not idle (step S14: No), the CPU 205 returns to step S12.

On the other hand, in the case where it is determined in step S13 that the shutter button 302c is pressed down fully (step S13: Yes), the CPU 205 determines whether or not the exposure value is equal to or less than a preset value (step S15).

In the case where it is determined that the exposure value exceeds the preset value (step S15: No), the CPU 205 directs the image capture data creation unit 21 to perform an image capture at high resolution and acquires one frame of high resolution image capture data (step S16).

In the case where it is determined that the exposure value is equal to or less than the preset value (step S15: Yes), the CPU 205 directs the image capture data creation unit 21 to perform image captures at high resolution and acquires a plurality of frames of image capture data (an amount of a plurality of images) (step S17).

The CPU 205 stores the image capture data acquired in step S16 or S17 in the sensor image storage region 201a of the memory 201 (step S18).

The CPU 205 instructs the image processing device 203 to perform an image processing (step S19) and ends the image capture processing.

Figure 4:
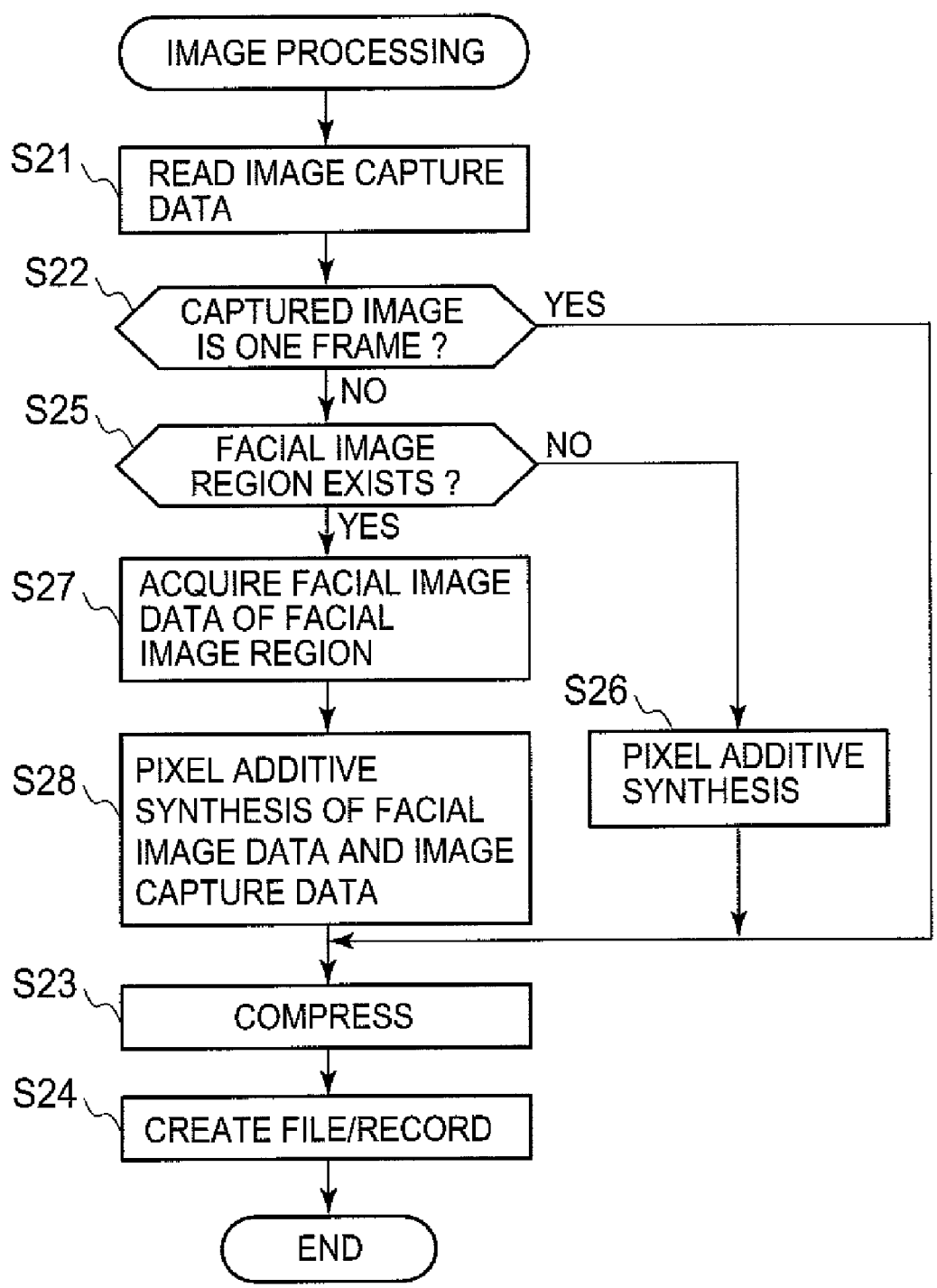
FIG. 4 illustrates a flowchart of an image processing executed by an image processing device.

The image processing device 203, upon receiving the instruction from the CPU 205, reads program data for image processing from the program code storage device 204 and executes an image processing according to the flowchart illustrated in FIG. 4.

The image processing device 203 reads image capture data from the sensor image storage region 201a of the memory 201 (step S21).

The image processing device 203 determines whether or not the image capture data that is read is one frame (step S22).

In the case where it is determined that the image capture data is one frame (step S22: Yes), the image processing device 203 compresses the image capture data that is read (step S23).

The image processing device 203 creates image data by creating a file of the compressed image capture data and records the result in the processed image storage region 201b of the memory 201 (step S24). Then, the image processing device 203 ends the image processing.

In the case where it is determined that the image capture data is not one frame (step S22: No), the image processing device 203 determines an existence or absence of a facial image region for each of the plurality of image capture data (step S25).

In the case where it is determined that a facial image region does not exist (step S25: No), the image processing device 203 provides a correspondence between the entire image capture data, adds pixels of the image capture data of the two frames for each pixel, and performs a pixel additive synthesis, which synthesizes the image capture data of the two frames (step S26).

The image processing device 203 compresses the synthesized image data (step S23), creates a file of the compressed image data, and records the result in the processed image storage region 201b of the memory 201 (step S24). Then, the image processing device 203 ends the image processing.

In the case where it is determined that a facial image region exists (step S25: Yes), the image processing device 203 acquires facial image data of the facial image region (step S27).

The image processing device 203, while performing a projective transformation and a position matching to provide a correspondence between the image data of the facial image region of the image capture data and the facial image data of the acquired facial image region, performs a pixel additive synthesis for adding pixels of the image capture data and the acquired facial image data of the facial image region for each pixel (step S28). In other words, gradation data G1 and G2 for two corresponding pixels of the two facial images are added. For example, in the case where gradation data is 100 for one of the images and is 99 for the other, the addition results in a new gradation of 199. The addition is also possible by performing a predetermined weighting operation such as, for example, W1·G1+W2·G2.

The image processing device 203 compresses the synthesized image data (step S23), creates a file of the compressed image data, and records the result in the processed image storage region 201b of the memory 201 (step S24). Then, the image processing device 203 ends the image processing.

Now, an example of the image processing executed by the image processing device 203 will be described.

Figure 5:
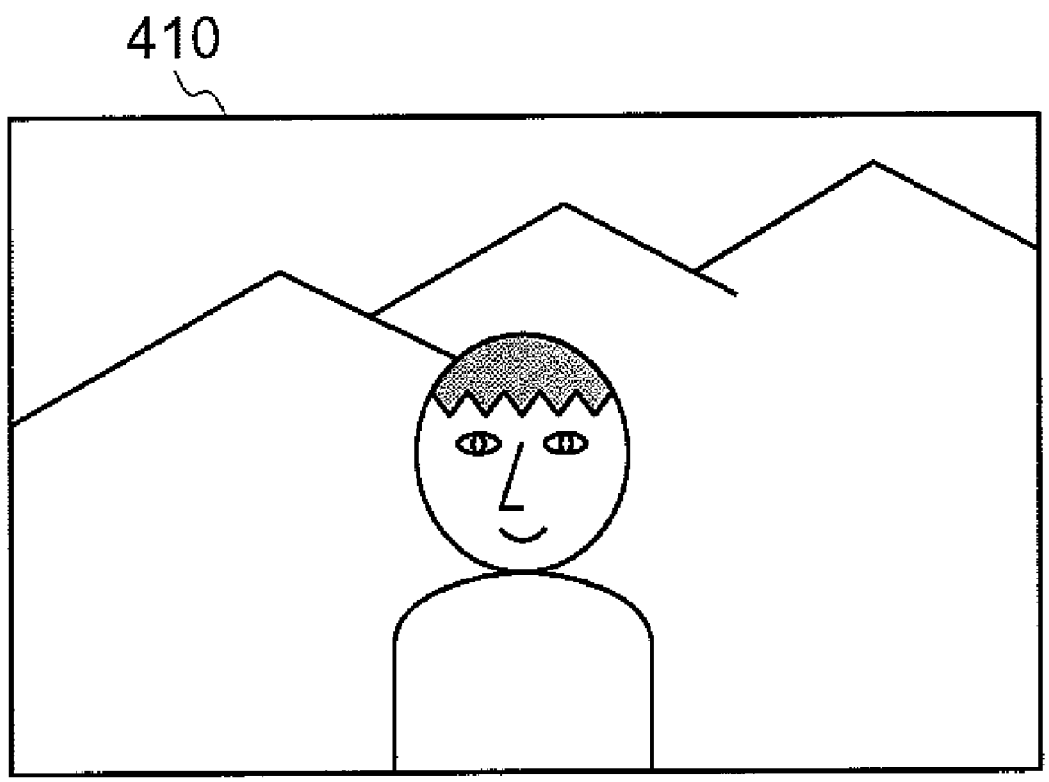
FIG. 5 illustrates an example of image capture data.

When the user half presses the shutter button 302c, the CPU 205 acquires, for example, low resolution image capture data 410 such as that illustrated in FIG. 5 (the processing of step S11).

In the case where an exposure value of the image capture data 410 exceeds a preset value (step S15: No), the CPU 205 directs the image capture data creation unit 21 to acquire only one frame of high resolution image capture data 410 (the processing of step S16).

The CPU 205 directs the image capture data creation unit 21 to store the image capture data 410 in the sensor image storage region 201a of the memory 201 (the processing of step S18).

The image processing device 203 reads the image capture data 410 from the sensor image storage region 201a of the memory 201 (step S21).

The image capture data 410 is only one frame (step S22: Yes), and therefore the image processing device 203 compresses the image capture data 410 without performing a pixel additive synthesis (the processing of step S23).

The image processing device 203 creates a file of the compressed image capture data 410 and records the result in the processed image storage region 201b of the memory 201 (the processing of step S24).

Figure 6A:
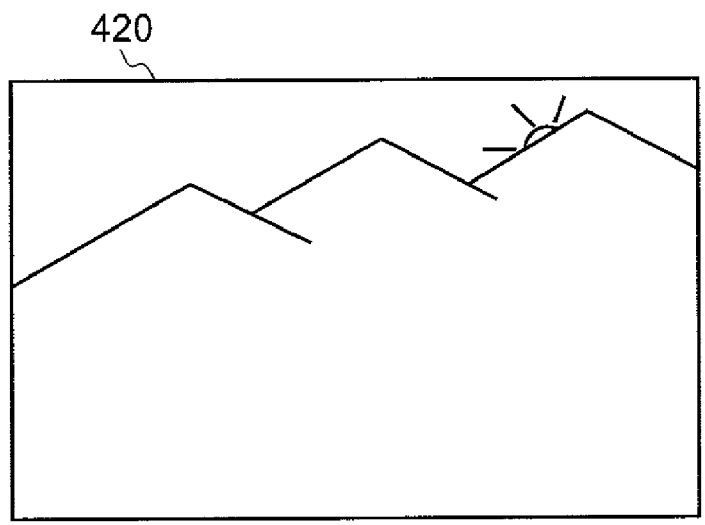
FIG. 6A illustrates an example of low resolution image capture data without a facial image, captured at an exposure value equal to or less than a preset value.

Next, it is assumed that an exposure value of image capture data 420, acquired when the user half presses the shutter button 302c, is equal to or less than the preset value as illustrated in FIG. 6A (step S15: Yes).

Figure 6B:
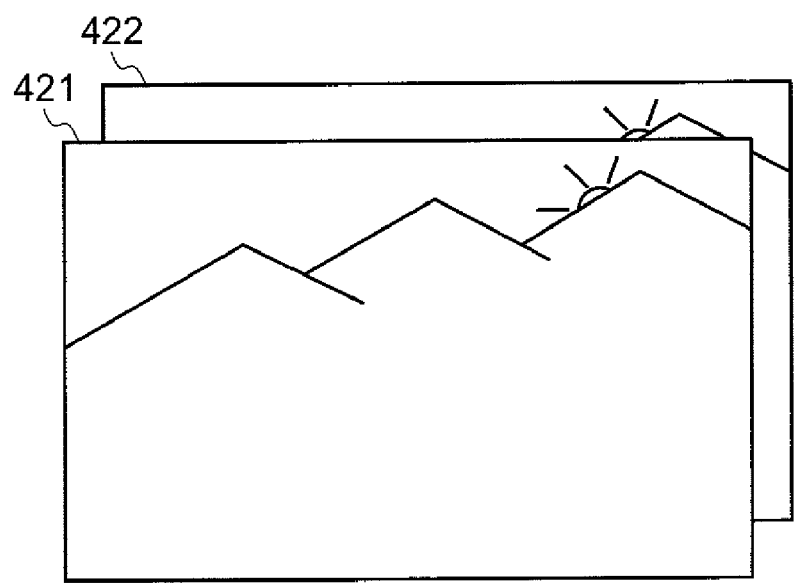
FIG. 6B illustrates an example of high resolution image capture data without a facial image, captured at an exposure value equal to or less than a preset value.

In this case, when the shutter button 302c is pressed down fully (step S13: Yes), the CPU 205 directs the image capture data creation unit 21 to acquire two frames of image capture data 421 and 422 as illustrated in FIG. 6B (step S17).

The image processing device 203 reads facial characteristic data from the operation data storage region 201c, compares the characteristic data to the two frames of the image capture data 421 and 422, and thereby determines that no facial image region exists in the two frames of the image capture data 421 and 422 (step S25: No).

Figure 7:
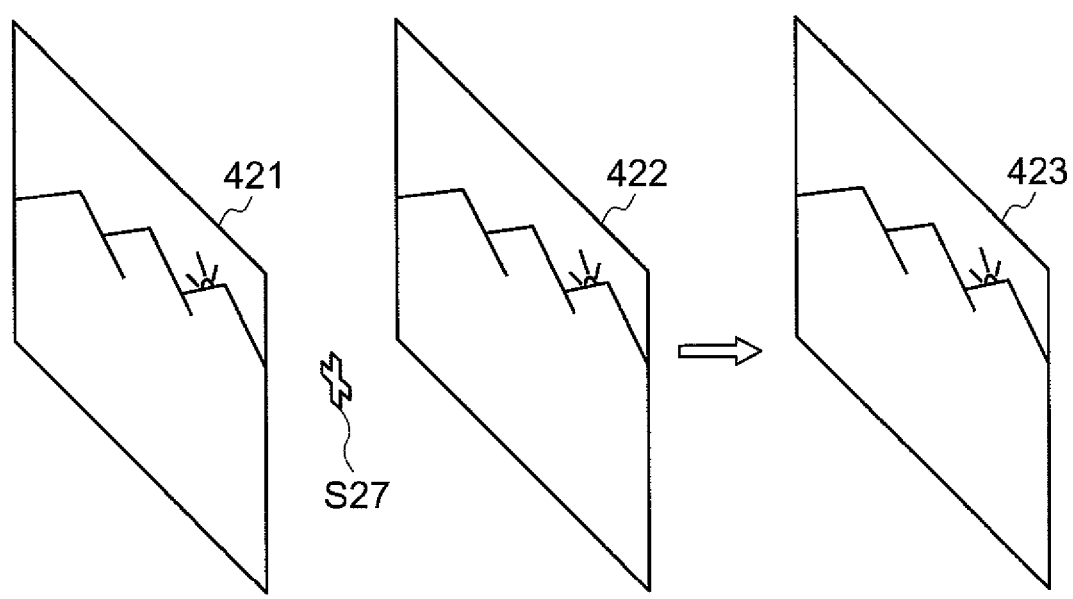
FIG. 7 illustrates an example of a pixel additive synthesis of the two frames of image capture data illustrated in FIG. 6B.

In this case, the image processing device 203 adds pixels of the entire image capture data of the image capture data 421 and 422 for each pixel and synthesizes the two frames of the image capture data 421 and 422 as illustrated in FIG. 7 (step S26). The image processing device 203 acquires image data 423 having an increased luminance as a result of performing the pixel additive synthesis.

The image processing device 203 compresses the image data 423 (the processing of step S23), creates a file of the compressed image data 423, and records the result in the processed image storage region 201b of the memory 201 (the processing of step S24).

Figure 8A:
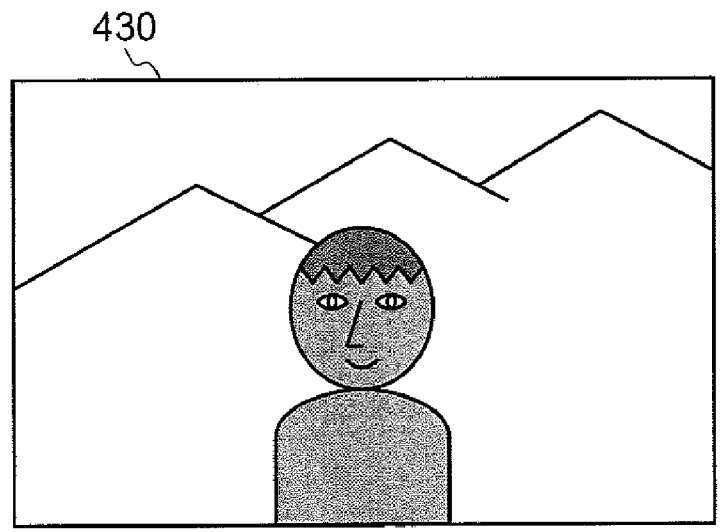
FIG. 8A illustrates an example of low resolution image capture data including a facial image, captured at an exposure value equal to or less than a preset value.

Next, it is assumed that an exposure value of image capture data 430, acquired when the user half pressed the shutter button 302c and including a facial image region, is equal to or less than a preset value as illustrated in FIG. 8A (step S15: Yes).

Figure 8B:
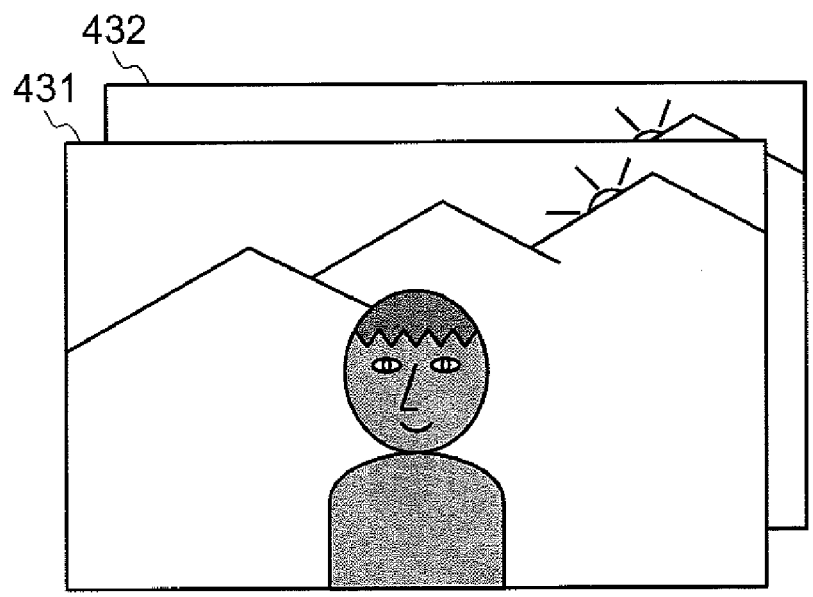
FIG. 8B illustrates an example of high resolution image capture data including a facial image, captured at an exposure value equal to or less than a preset value.

In this case, when the shutter button 302c is pressed down fully (step S13: Yes), the CPU 205 directs the image capture data creation unit 21 to acquire two frames of image capture data 431 and 432 as illustrated in FIG. 8B (step S17).

The image processing device 203 compares each of the facial characteristic data read from the operation data storage region 201c to the two frames of image capture data 431 and 432 and thereby determines that a facial image region exists (the processing of step S25).

Figure 9:
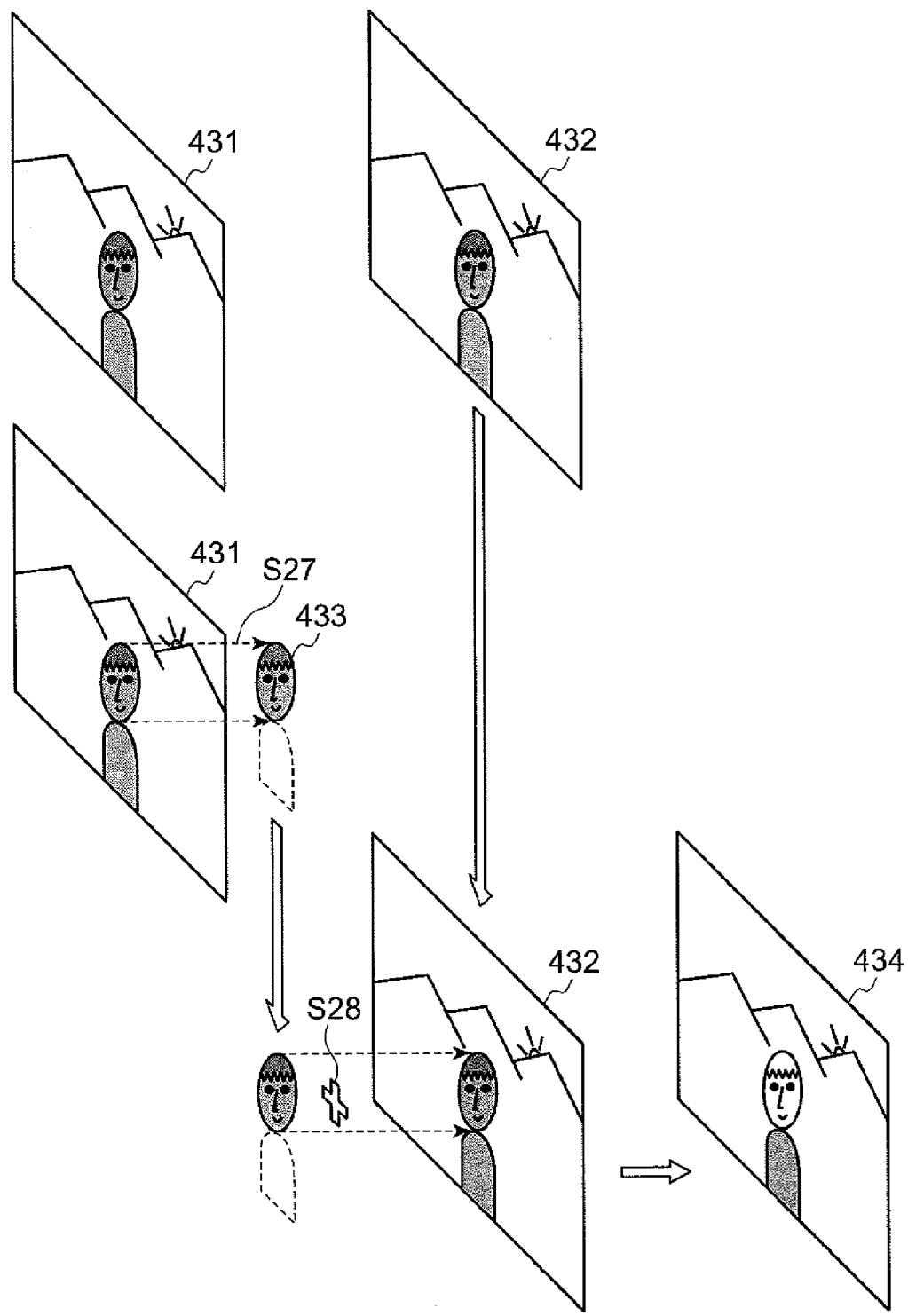
FIG. 9 illustrates an example of a pixel additive synthesis of the two frames of image capture data illustrated in FIG. 8B.

Then, the image processing device 203 acquires facial image data 433 of the facial image region from image capture data 431 as illustrated in FIG. 9 (the processing of step S27).

The image processing device 203, while performing a projective transformation and a position matching between the acquired facial image data 433 and the image capture data 432, performs a pixel additive synthesis of the facial image data 433 and the image capture data 432 (the processing of step S28). As a result of performing the pixel additive synthesis, the image processing device 203 acquires image data 434 having an increased luminance of the image of the facial image region without requiring an illumination by a strobe light.

The image processing device 203 compresses the image data 434 (the processing of step S23), creates a file of the compressed image data 434, and records the result in the processed image storage region 201b of the memory 201 (the processing of step S24).

As recited above, according to this embodiment, in the case where an exposure value of low resolution image capture data is equal to or less than a preset value, the CPU 205 directs the image capture data creation unit 21 to acquire two frames of image capture data.

In the case where it is determined that a facial image region is included in the two frames of image capture data, the image processing device 203 acquires facial image data from the facial image region; adds pixels of the acquired facial image data and the facial image region of the other frame of image capture data for each pixel while performing a position matching; and thereby acquires an image having an increased luminance of the facial image.

Therefore, even in the case where the luminance is low, the luminance of the facial image can be increased without an illumination by a strobe light.

Also, an illumination by a strobe light is not used. Therefore a clear image of the main subject can be acquired, even in the case where an object other than the main subject is included in the angle of view for capturing images.

Furthermore, in the case where the luminance is increased using one frame of image capture data, it is necessary to increase the sensitivity of the CCD. Herein, conversely, the luminance is increased using two frames of image capture data. Therefore, it is not necessary to increase the sensitivity of the CCD, and effects of thermal noise can be suppressed.

Regarding the implementation of the present invention, various embodiments are conceivable, and the present invention is not limited to the embodiment recited above.

For example, in the embodiment recited above, two frames of image capture data were used. However, any number of frames may be used as long as at least two frames of image capture data are used. For example, in the case where a facial image region exists, the image processing device 203 may acquire a plurality of frames of facial image data of the facial image region from a plurality of frames of image capture data, and then add pixels of the image capture data of one frame or a plurality of frames to the facial image data of the plurality of frames for each pixel. Thus, the luminance of the image of the facial image region can be further increased.

According to the embodiment recited above, the image processing device 203 acquires only facial image data of the facial image region. However, the image processing device 203 may acquire image data for not only the facial image region but also for an entire human body; and pixel additive synthesis may be performed for the image capture data and image data of the entire human body. Thus, the luminance can be increased for not only the facial image region but also for the entire human body.

According to the embodiment recited above, the image processing device 203, in the case where a facial image region is detected, performs the detection of the facial image region by comparing facial characteristic data stored in advance to image capture data. However, the detection of the facial image region is not limited to such processing.

For example, the image processing device 203 may detect an edge image from image capture data, and a facial image region may be determined based on an edge image of a detected face. Alternatively, the image processing device 203 may detect skin color and thereby determine a facial image region.

According to the embodiment recited above, the image processing device 203 detects a human facial image region as a specific image region. However, the specific image region is not limited to a human facial image region. For example, the image region of an animal may be used. Furthermore, allowing a selection of a specific image region in advance can enable an enhancement of specific image data of the specific image region. For example, designated items such as designated machines, designated landscapes, designated marks or symbols, etc. may be used.

Second Embodiment

Many of present digital cameras include a so-called autofocus function, which focuses on a main subject in a designated portion of the image (commonly, the center of the image). This image portion used for such an autofocus function is referred to herein as the focus point detection region.

The focus point detection region is a region in the center of the image. Therefore, in the case where a specific image region exists in the focus point detection region, a pixel additive synthesis maybe performed for an image of the specific image region, and the specific image in the focus point detection region may be accentuated.

In the second embodiment of the present invention, a procedure for determining whether or not a common specific image region exists in focus point detection regions of images of a plurality of image capture data, and for performing an image processing will be described.

The configuration of a digital camera 1 according to this embodiment is a configuration similar to that of the digital camera 1 according to the first embodiment as described with reference to FIG. 1 and FIG. 2. Furthermore, the image capture processing is likewise similar to the image capture processing according to the first embodiment as described with reference to FIG. 3.

Below, a characteristic image processing will be described.

Figure 10:
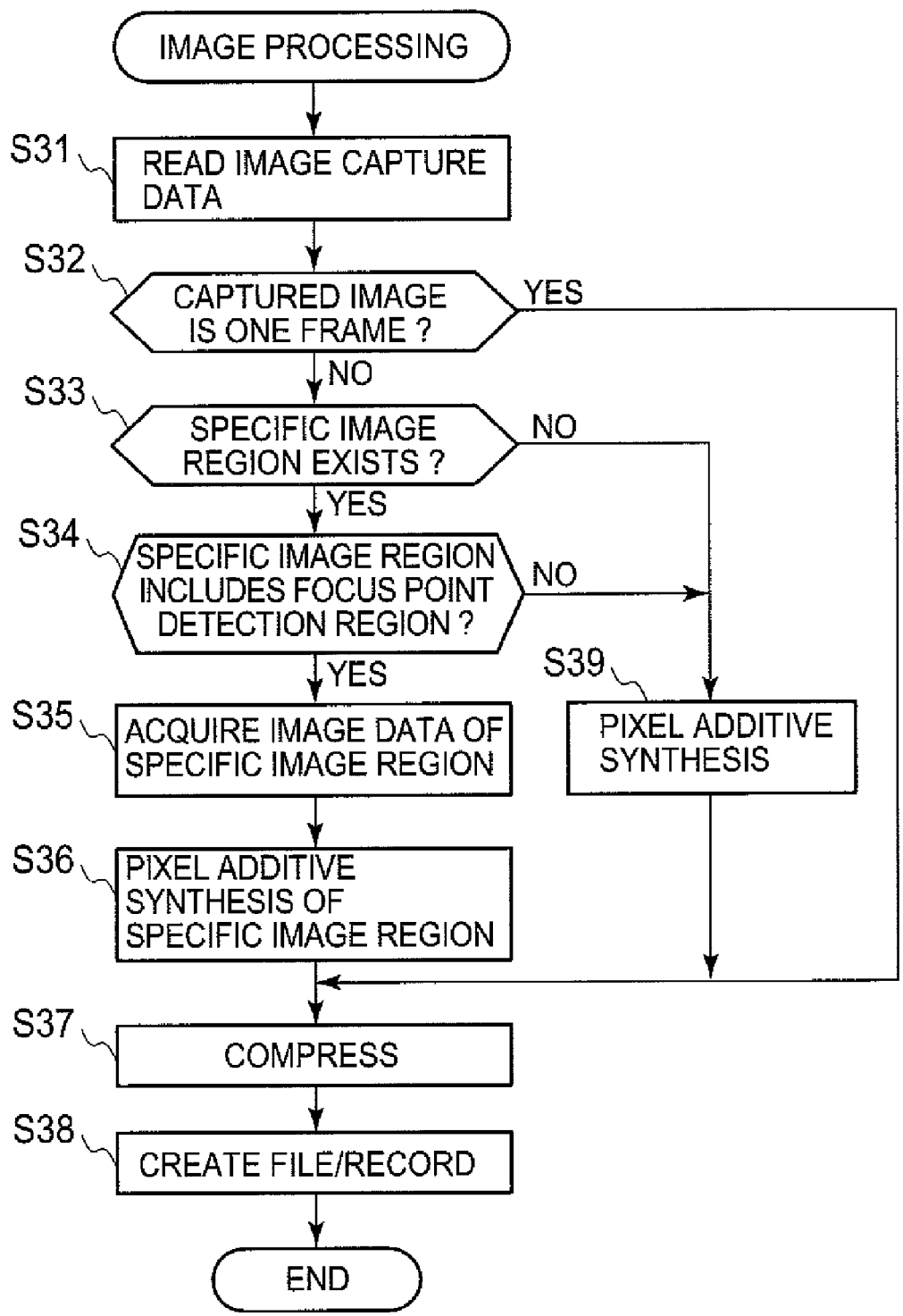
FIG. 10 illustrates a flowchart of image processing executed by an image processing device.

The image processing device 203 receives an instruction from the CPU 205, reads program data for image processing from the program code storage device 204, and executes image processing such as that in the flowchart illustrated in FIG. 10.

The image processing device 203 reads image capture data from the sensor image storage region 201*a* of the memory 201 (step S31).

Then, the image processing device 203 determines whether or not the image capture data that is read is one frame (step S32).

In the case where the image capture data is only one frame (step S32: Yes), the image processing device 203 compresses the image capture data that is read (step S37).

Then, the image processing device 203 creates image data by creating a file of the compressed image capture data, records the result in the processed image storage region 201*b* of the memory 201 (step S38), and ends the image processing.

In the case where a plurality of image capture data exists (step S32: No), the image processing device 203 determines an existence or absence of a specific image region in each of the plurality of image capture data (step S33).

In the case where it is determined that no specific image region exists (step S33: No), the image processing device 203 provides a correspondence among the entire image capture data, adds pixels of the two frames of image capture data, and synthesizes (pixel additive synthesis) the two frames of image capture data (step S39).

In the case where it is determined that a specific image region exists (step S33: Yes), the image processing device 203 reads positional data of the focus point detection region from the sensor image storage region 201*a* and determines whether or not the specific image region includes the focus point detection region of the image capture data (step S34).

In the case where it is determined that the specific image region does not include the focus point detection region (step S34: No), the image processing device 203 provides a correspondence between the entire image capture data, adds pixels of the two frames of image capture data, and synthesizes (pixel additive synthesis) the two frames of image capture data (step S39).

In the case where it is determined that the specific image region includes the focus point detection region (step S34: Yes), the image processing device 203 determines the two frames of image capture data between standard image capture data and additional image capture data, and acquires image data of the specific image region included in the additional image capture data (step S35).

The image processing device 203 performs a projective transformation and a position matching to provide a correspondence between the image data of the specific image region of the standard image capture data and the image data of the specific image region acquired from the additional image capture data; adds pixels of the image data of the specific image region included in the additional image capture data to those of the standard image capture data for each pixel; and synthesizes (pixel additive synthesis) the image data of the specific image region included in the additional image capture data and the standard image capture data (step S36).

The image processing device 203 compresses the synthesized image data (step S37), creates a file of the result, records the result in the processed image storage region 201b of the memory 201 (step S38), and ends the image processing.

Next, the specifics of the image processing executed by the image processing device 203 will be described.

Figure 11:
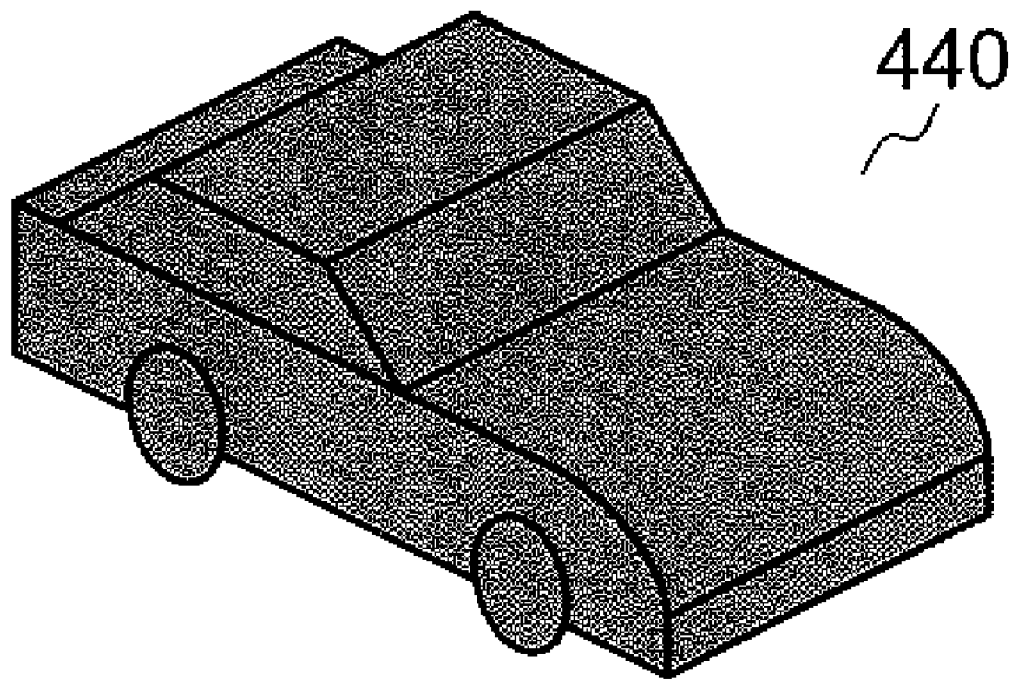
FIG. 11 illustrates an example of characteristic data of a specific image region.

It is assumed that automobile image data 440 such as that illustrated in FIG. 11 is stored in the operation data storage region 201c as image data of a specific image region.

Figure 12:
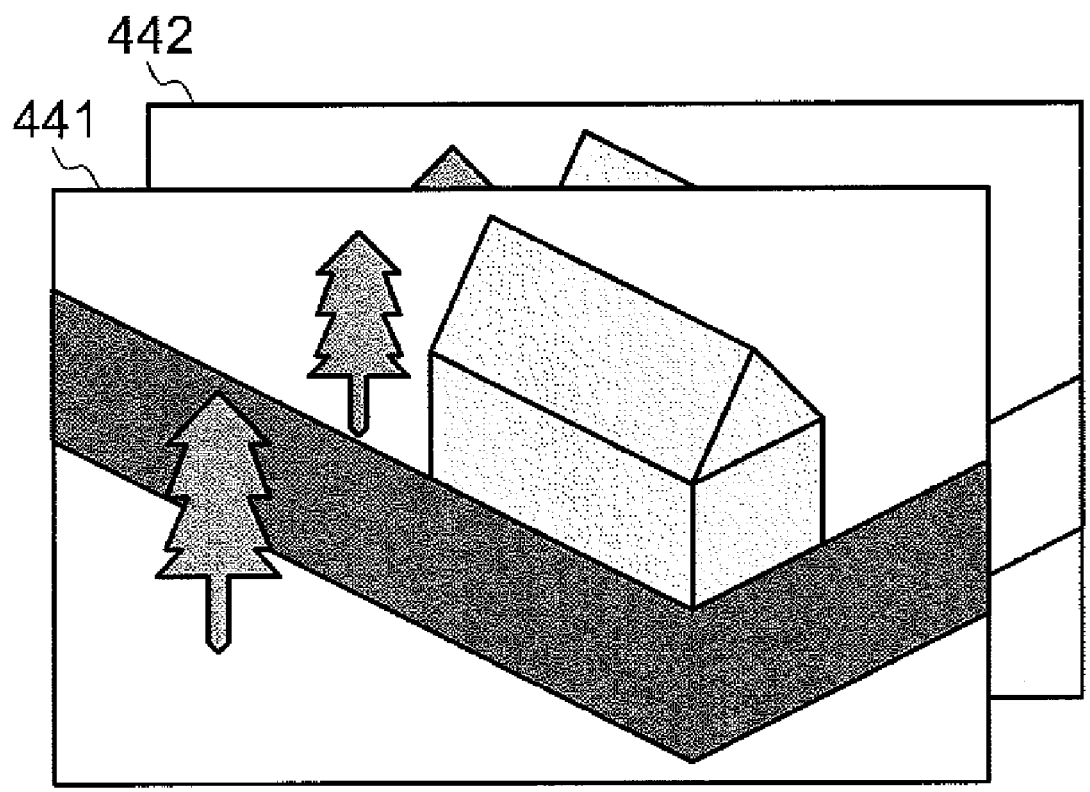
FIG. 12 illustrates an example of image capture data without a specific image region.

In the case where two frames of image capture data 441 and 442, as illustrated in FIG. 12, are stored in the sensor image storage region 201a, the image processing device 203 compares the image capture data 441 and 442 to the automobile image data 440, and detects that no specific image region exists in the image capture data 441 and 442 (step S33: No).

No specific image region exists in the image capture data 441 and 442, and therefore the image processing device 203 adds pixels of the entire image capture data of the image capture data 441 and 442 for each pixel, synthesizes the image capture data 441 and the image capture data 442, and increases the luminance of the entire image (step S39).

Figure 13A:
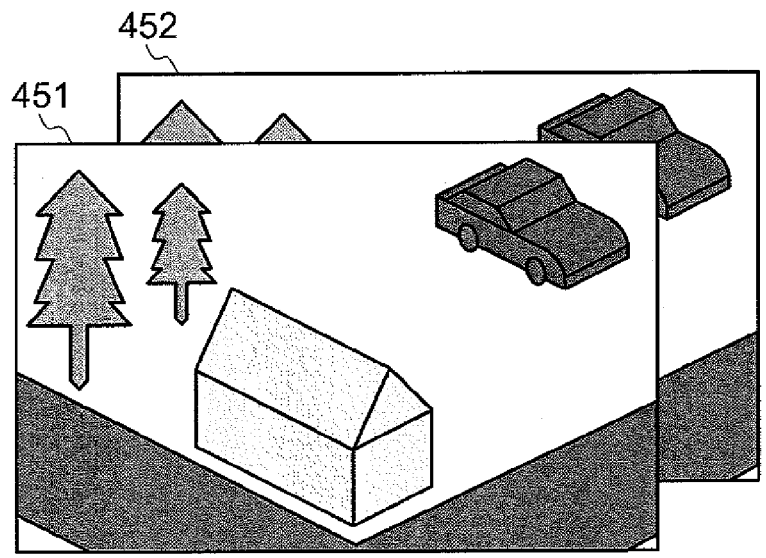
FIG. 13A illustrates an example of image capture data including a specific image region.

Also, in the case where two frames of image capture data 451 and 452 as illustrated in FIG. 13A are stored in the sensor image storage region 201a, the image processing device 203 compares each of the image capture data 451 and 452 to the automobile image data 440 and detects that a specific image region exists in the image capture data 451 and 452 (step S33: Yes).

Figure 13B:
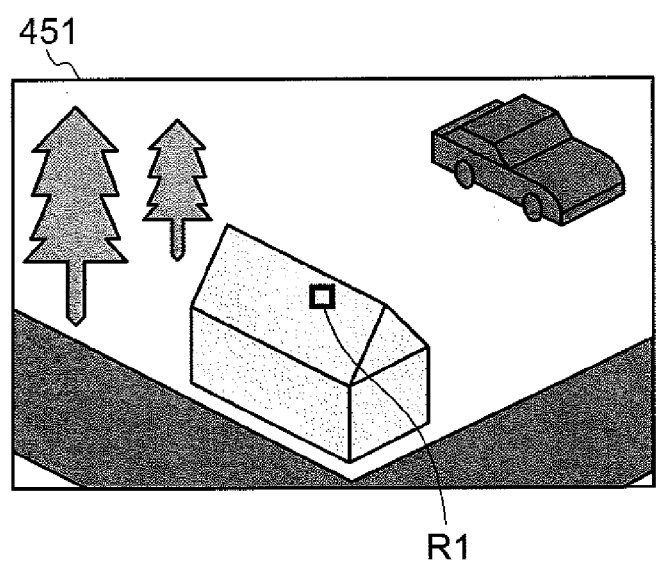
FIG. 13B illustrates an example of a focus point detection region of image capture data.

It is determined in step S33 that a specific image region exists in the image capture data 451 and 452, and therefore the image processing device 203 then determines whether or not the specific image region includes a focus point detection region R1 of the image capture data 451 (referring to FIG. 13B) (step S34).

In this case, the specific image region does not include the focus point detection region R1 (step S34: No), and therefore the image processing device 203 adds pixels of the entire image capture data 451 and 452 for each pixel, synthesizes the image capture data 451 and the image capture data 452, and increases the luminance of the entire image (step S39).

Figure 14A:
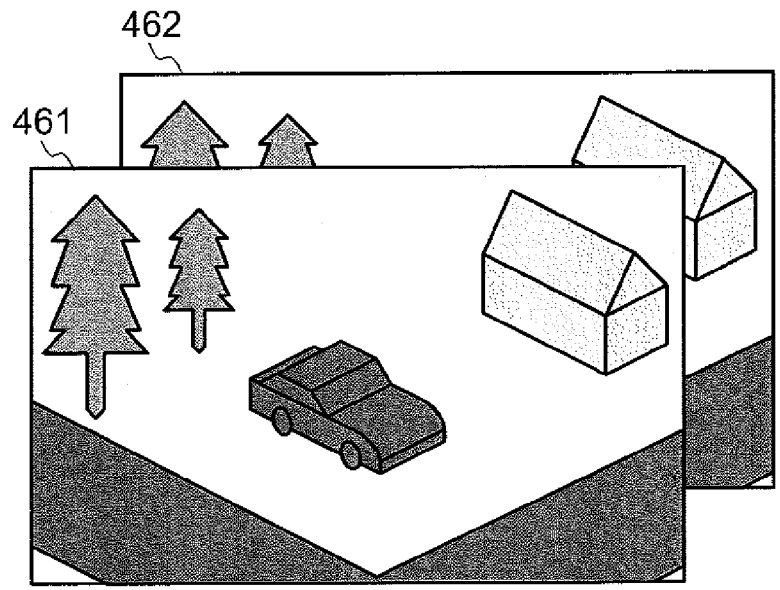
FIG. 14A illustrates an example of image capture data including a specific image region.

In the case where two frames of image capture data 461 and 462 as illustrated in FIG. 14A are stored in the sensor image storage region 201a, the image processing device 203 compares each of the image capture data 461 and 462 to the automobile image data 440 and thereby detects that a specific image region exists in the image capture data 461 and 462 (step S33: Yes).

Figure 14B:
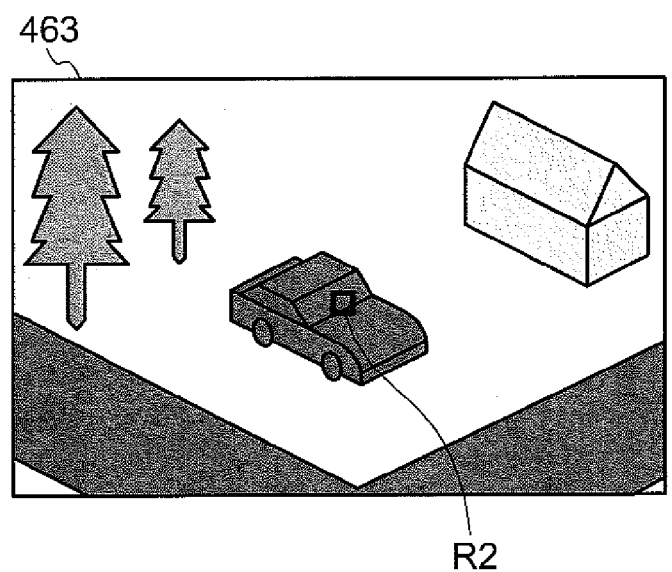
FIG. 14B illustrates an example of a focus point detection region of image capture data.

It is determined in step S33 that a specific image region exists in the image capture data 461 and 462, and therefore the image processing device 203 then determines whether or not the specific image region includes a focus point detection region R2 of the image capture data 461 (referring to FIG. 14B) (step S34).

Figure 15:
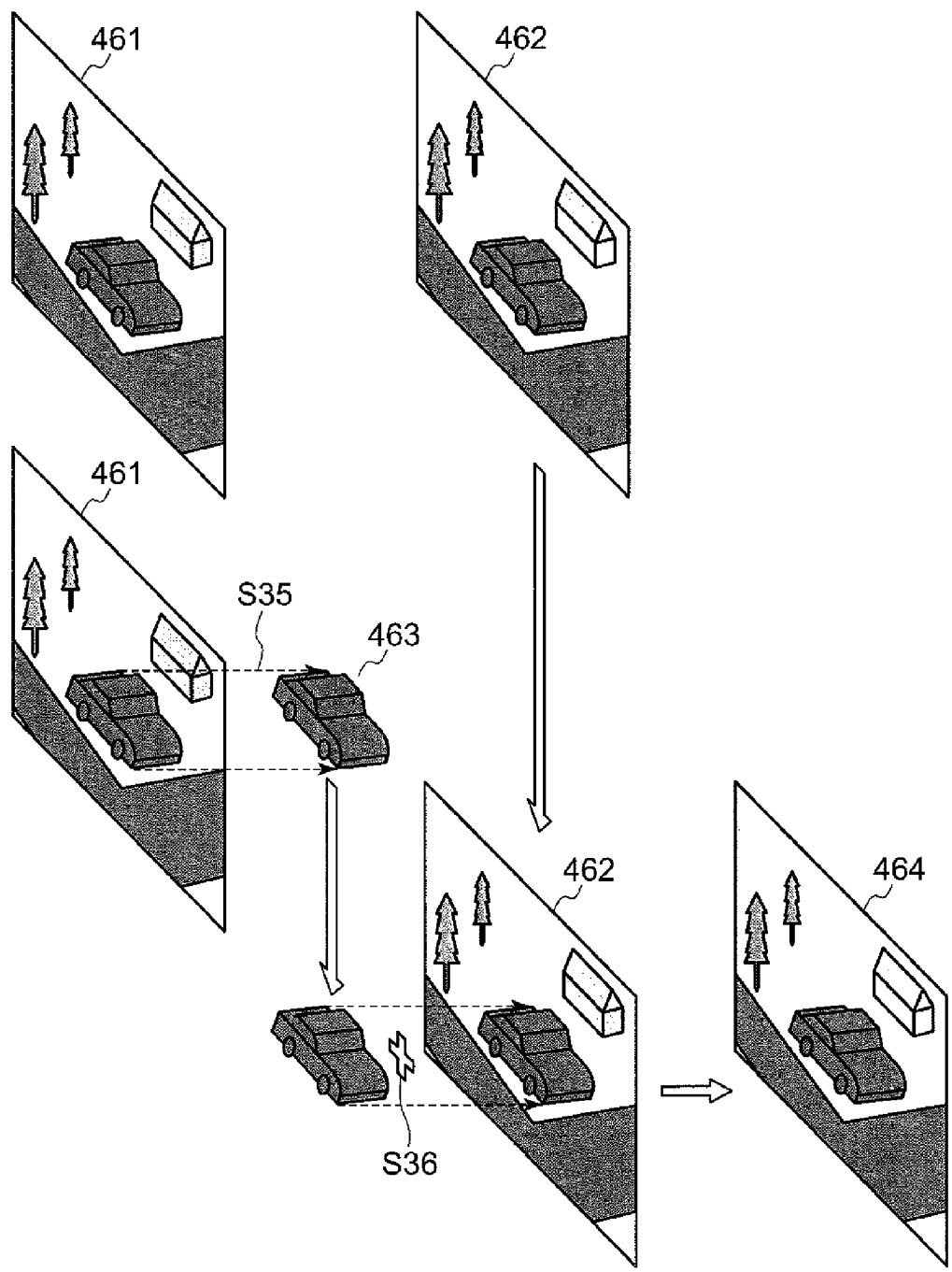
FIG. 15 illustrates an example of a pixel additive synthesis of the two frames of image capture data illustrated in FIG. 14B.

In the case where the image processing device 203 detects that the specific image region includes the focus point detection region R2 (step S34: Yes), image data 463 of the specific image region is acquired from the image capture data 461 as illustrated in FIG. 15 (step S35).

The image processing device 203 performs a projective transformation and a position matching for the image data 463 and the image capture data 462, adds pixels of the image data 463 and the image capture data 462 for each pixel, synthesizes the image data 463 and the image capture data 462, and acquires image data 464 (step S36).

As above, a pixel additive synthesis is performed for the specific image region only in the case where the specific image region includes the focus point detection region, and therefore the specific image region in the focus point detection region can be accentuated.

As recited above, the specific image included in the specific image region is not limited to images of human faces or vehicles. Any suitable specific image data may be recorded in advance in the memory 201 to detect the specific image in the image capture data.

According to the embodiment recited above, a search for a specific image region was performed for all regions of the images of the image capture data in step S33. However, a search may be performed for a specific image region in only a partial region of the images of the image capture data. For example, in the case where it is known that the specific image region is smaller than a region of a predetermined size around the focus point detection region, the image processing device 203 may determine whether or not the specific image region exists in the region of a predetermined size around the focus point detection region of the image capture data (step S33'). Furthermore, in the case where the specific image region exists in the region of a predetermined size around the focus point detection region of the image capture data, step S34 may be skipped and step S35 maybe executed.

Moreover, the designated portion is not limited to the focus point detection region, and any suitable location may be used. For example, an image may be displayed on the display unit 301, thereby enabling a selection of the designated portion thereon by any suitable interface.

Additionally, any suitable method for adding pixels and synthesizing images may be used, and an addition with a weighting operation may be used as recited above.

In the first embodiment and the second embodiment recited above, the case where one specific image region is included in the image capture data is described, but the image capture data may include two or more specific image regions.

In the embodiments recited above, the programs are described as components stored in advance in memory and the like. However, programs for executing the processing of the image processing device or digital camera (image capture device) recited above may be stored in readable recording media such as a flexible disk, CD-ROM (Compact Disk Read-Only Memory), DVD (Digital Versatile Disk), and MO (Magneto Optical disk). The programs may be distributed and installed in an image processing device or digital camera (image capture device). The image processing device or digital camera (image capture device) may be operated by the methods recited above, or the steps recited above may be executed in the image processing device or digital camera (image capture device).

Also, the programs for executing the image processing illustrated in the flowcharts of FIG. 4 and FIG. 10 may be installed in a computer; image capture data captured by a digital camera (image capture device) may be read into a memory of the computer; and the image processing recited above may be executed by the computer.

Furthermore, programs may be stored in advance in a disk device, etc. of a server device on the internet; superimposed, for example, on a carrier wave; and placed in a computer by downloading, etc.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2007-256213 filed on Sep. 28, 2007 and Japanese Patent Application No. 2008-203649 filed on Aug. 6, 2008. The disclosure of the above Japanese Patent Applications, including specifications, claims, and drawings, is incorporated herein by reference in its entirety.

What is claimed is:

1. An image capture device comprising:
   an image capture unit that performs an image capture and acquires image capture data;
   an image capture control unit that directs the image capture unit to perform image captures a plurality of times and acquire a plurality of image capture data;
   a determination unit that determines whether or not a common specific image region exists in the plurality of image capture data acquired by the direction of the image capture control unit;
   an image data creation unit that performs a pixel additive synthesis for image data of the common specific image region in a case where in which the determination unit determines that the common specific image region exists, and creates image data;
   an exposure value setting unit that sets an exposure value based on a luminance value of image capture data acquired by the image capture unit; and
   a comparison unit that compares the exposure value set by the exposure value setting unit to a preset value;
   wherein the image capture control unit directs the image capture unit to perform the image captures the plurality of times in a case in which, according to a result of the comparison by the comparison unit, the exposure value is equal to or less than the preset value.

2. The image capture device according to claim 1, wherein the determination unit determines whether or not the common specific image region exists in a designated portion of images corresponding to the plurality of image capture data.

3. The image capture device according to claim 2, wherein the designated portion comprises a focus point detection region in which the image capture unit performs a focal adjustment.

4. The image capture device according to claim 1, wherein the specific image region comprises a facial image region of one of a human and an animal.

5. The image capture device according to claim 1, comprising:
   a storage unit;
   wherein the specific image region comprises a region having substantial similarity to a specific image stored in the storage unit.

6. A non-transitory recording medium storing a program that causes a computer, included in an image capture device, to function as units comprising:
   a determination unit that determines whether or not a common specific image region exists in a plurality of image capture data acquired by a plurality of image captures;
   an image data creation unit that performs a pixel additive synthesis for image data of the common specific image region in a case in which the determination unit determines that the common specific image region exists, and creates image data;
   an exposure value setting unit that sets an exposure value based on a luminance value of image capture data;
   a comparison unit that compares the exposure value set by the exposure value setting unit to a preset value; and
   an image capture control unit that directs that the plurality of image captures be performed in a case in which, according to a result of the comparison by the comparison unit, the exposure value is equal to or less than the preset value.

* * * * *